United States Patent
Huang et al.

(10) Patent No.: US 12,525,973 B2
(45) Date of Patent: Jan. 13, 2026

(54) RADIO FREQUENCY SWITCH FOR REDUCING SIGNAL REFLECTION

(71) Applicant: RichWave Technology Corp., Taipei (TW)

(72) Inventors: Yu-Siang Huang, Taipei (TW); Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 128 days.

(21) Appl. No.: 18/372,681

(22) Filed: Sep. 25, 2023

(65) Prior Publication Data

US 2024/0195411 A1     Jun. 13, 2024

(30) Foreign Application Priority Data

Dec. 13, 2022   (TW) .................................. 111147801

(51) Int. Cl.
*H03K 17/687*    (2006.01)

(52) U.S. Cl.
CPC ................................. *H03K 17/6871* (2013.01)

(58) Field of Classification Search
CPC ............. H03K 17/6871; H03K 17/693; H03K 17/687; H03K 17/689
See application file for complete search history.

(56) References Cited

U.S. PATENT DOCUMENTS

| | | |
|---|---|---|
| 6,653,697 B2 | 11/2003 | Hidaka |
| 10,200,027 B1 | 2/2019 | Kim |
| 10,291,223 B2 | 5/2019 | Prevost |
| 2003/0001622 A1* | 1/2003 | Fletcher ............. H03K 19/0963 326/95 |
| 2004/0227683 A1* | 11/2004 | Caimi ...................... H01Q 9/40 343/742 |

(Continued)

FOREIGN PATENT DOCUMENTS

| | | |
|---|---|---|
| CN | 109936355 A | 6/2019 |
| CN | 113285697 A | 8/2021 |

(Continued)

OTHER PUBLICATIONS

Office action mailed on Mar. 28, 2024 for the U.S. Appl. No. 17/688,916, filed Mar. 8, 2022, p. 1-18 ,Mar. 28, 2024.

(Continued)

*Primary Examiner* — Metasebia T Retebo
(74) *Attorney, Agent, or Firm* — Winston Hsu

(57) ABSTRACT

A radio frequency switch includes a signal terminal, a reference voltage terminal, and a shunt switch path. The shunt switch path includes a first transistor and a second transistor. The first transistor includes a first terminal coupled to the signal terminal, a second terminal, and a control terminal. The second transistor includes a first terminal coupled to the second terminal of the first transistor, a second terminal coupled to the reference terminal, and a control terminal. When the shunt switch path is switched to a first state, the shunt switch path has a first impedance. When the shunt switch path is switched to a second state, the shunt switch path has a second impedance, the first impedance and the second impedance being different. The first impedance is between 40 ohms to 85 ohms.

20 Claims, 5 Drawing Sheets

(56) References Cited

U.S. PATENT DOCUMENTS

| | | | |
|---|---|---|---|
| 2013/0029614 A1* | 1/2013 | Cho .................. | H04B 1/48 |
| | | | 455/83 |
| 2016/0285447 A1* | 9/2016 | Krishnamurthi ..... | H03K 17/693 |
| 2018/0316350 A1* | 11/2018 | Brindle .............. | H03K 19/0005 |
| 2019/0237851 A1* | 8/2019 | Gu ..................... | H01Q 5/35 |
| 2020/0358427 A1 | 11/2020 | Weale | |
| 2023/0198565 A1 | 6/2023 | Huang | |

FOREIGN PATENT DOCUMENTS

| | | |
|---|---|---|
| CN | 113595542 A | 11/2021 |
| CN | 108736866 B | 12/2021 |
| CN | 115021737 A | 9/2022 |
| TW | M355469 U1 | 4/2009 |
| TW | I693742 B | 5/2020 |
| WO | 2011/149596 A1 | 12/2011 |

OTHER PUBLICATIONS

Office action mailed on Jul. 7, 2023 for the Taiwan application No. 111147801, filing date Dec. 13, 2022, pp. 1-11.
Office action mailed on Sep. 13, 2023 for the Taiwan application No. 111147801, filing date Dec. 13, 2022, pp. 1-10.
Office action mailed on May 24, 2022 for the Taiwan application No. 110147316, filing date Dec. 17, 2021, pp. 1-5.

\* cited by examiner

RADIO FREQUENCY SWITCH FOR REDUCING SIGNAL REFLECTION

TECHNICAL FIELD

The present invention relates to a radio frequency (RF) circuit, and in particular, to a RF switch for reducing signal reflection in a RF circuit.

BACKGROUND

Radio frequency (RF) switches may direct RF signals to pass through one or more transmission paths, and are widely used in televisions, mobile phones, wireless communication devices, WiFi devices, Bluetooth devices and satellite communication devices.

In the related art, when the RF switch is turned off, the RF signal might be reflected from the RF switch to result in damages to the signal source, leading to an abnormal operation of the RF switch.

SUMMARY

According to an embodiment of the invention, a radio frequency switch includes an antenna, an RF circuit, a reference voltage terminal and a shunt path. The shunt switch path includes a first transistor and a second transistor. The first transistor includes a first terminal coupled between the antenna and the RF circuit, a second terminal, and a control terminal. The second transistor includes a first terminal coupled to the second terminal of the first transistor, a second terminal coupled to the reference terminal, and a control terminal. When the shunt switch path is switched to a first state, the first transistor and the second transistor are turned on, the shunt switch path has a first impedance. When the shunt switch path is switched to a second state, the first transistor and the second transistor are turned off, the shunt switch path has a second impedance. The equivalent resistance of the antenna and the equivalent resistance of the RF circuit are be substantially equal, and the first impedance matched the equivalent resistance of the antenna and the equivalent resistance of the RF is between 40 ohms and 85 ohms.

According to another embodiment of the invention, a radio frequency switch includes a signal terminal, a reference voltage terminal, and a shunt switch path. The shunt switch path includes a first transistor and a second transistor. The first transistor includes a first terminal coupled to the signal terminal, a second terminal, and a control terminal. The second transistor includes a first terminal coupled to the second terminal of the first transistor, a second terminal coupled to the reference terminal, and a control terminal. When the shunt switch path is switched to a first state, the shunt switch path has a first impedance. When the shunt switch path is switched to a second state, the shunt switch path has a second impedance, the first impedance and the second impedance being different. The first impedance is between 40 ohms to 85 ohms.

According to another embodiment of the invention, a first signal terminal, a reference voltage terminal, and N stacked transistors. The first signal terminal is coupled to a load having a load impedance. The N stacked transistors include a first terminal coupled to the first signal terminal, a second terminal coupled to the reference voltage terminal, and a control terminal, N being a positive integer exceeding 1. When the N stacked transistors are turned on, the N stacked transistors have a first impedance, when the N stacked transistors are turned off, the N stacked transistors have a second impedance, the N stacked transistors have a second impedance, the first impedance being different from the second impedance. The first impedance matches the load impedance.

DETAILED DESCRIPTION

Figure 1:
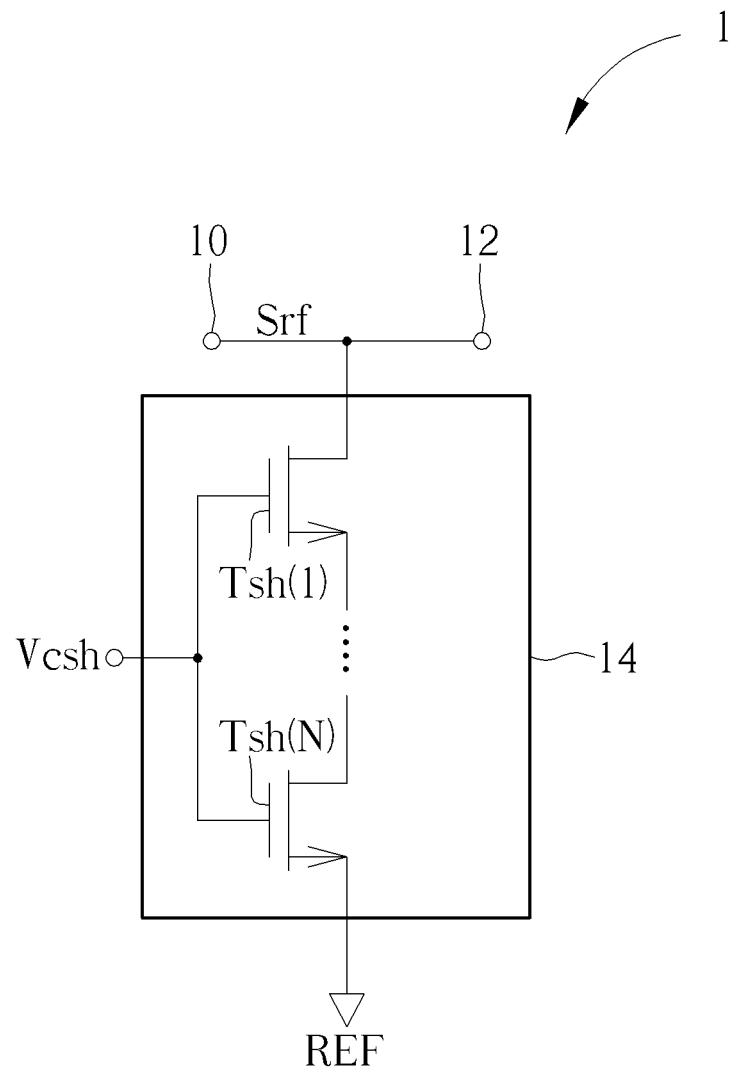
FIG. 1 is a schematic diagram of a radio frequency (RF) switch according to an embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a schematic diagram of a radio frequency (RF) switch 1 according to an embodiment of the invention. The RF switch 1 may be set at a transmission path or a reception path of the radio frequency signal Srf.

The RF switch 1 includes a signal terminal 10, a reference voltage terminal REF, a shunt path 14, and a signal terminal 12. The shunt path 14 is coupled to the signal terminals 10 and 12 and the reference voltage terminal REF. The signal terminal 10 may be coupled to one of an antenna and an RF circuit, and the signal terminal 12 may be coupled to the other one of the antenna and the RF circuit. The reference voltage terminal REF may provide a reference voltage such as 0V. When the RF switch 1 is turned on, the shunt path 14 may cut off coupling between the signal terminal 10 and the reference voltage terminal REF to transmit the RF signal Srf between the signal terminal 10 and the signal terminal 12. When the RF switch 1 is turned off, the shunt path 14 may establish coupling between the signal terminal 10 and the reference voltage terminal REF to guide the RF signal Srf to the reference voltage terminal REF. When turned off, the RF switch 1 of the present invention may enable the shunt path 14 to provide an equivalent resistance equal to the load resistance, fully guiding the RF signal Srf to the reference voltage terminal REF without generating signal reflection, thereby protecting the signal source from being damaged by the signal reflection. The load resistance may be equivalent resistance of the antenna or the RF circuit, and may have a value between 40 ohms (Ω) and 85Ω.

The shunt path 14 may include transistors Tsh(1) to Tsh(N), and the transistors Tsh(1) to Tsh(N) may be stacked sequentially, N being a positive integer exceeding 1. For example, if N=2, the shunt path 14 includes a transistor Tsh(1) and a transistor Tsh(2). The transistor Tsh(1) includes a first terminal coupled to the signal terminals 10 and 12; a second terminal; and a control terminal configured to receive a control signal Vcsh. The transistor Tsh(2) includes a first terminal coupled to the second terminal of the transistor Tsh(1); a second terminal coupled to the reference voltage terminal REF; and a control terminal configured to receive the control signal Vcsh. In some embodiments, the second terminal of the transistor Tsh(2) may be directly connected to the reference voltage terminal REF.

The transistors Tsh(1) to Tsh(N) may include a first terminal coupled to the signal terminals 10 and 12; a second terminal coupled to the reference voltage terminal REF; and a control terminal configured to receive the control signal Vcsh. The transistor sizes of the transistors Tsh(1) to Tsh(N) may be equal or different, and the transistor number N of the transistors Tsh(1) to Tsh(N) may be determined by the power of the radio frequency signal Srf. For example, the transistor number N of the transistors Tsh(1) to Tsh(N) in the sub-shunt circuit 14 increases with the power of the RF signal Srf, so as to provide sufficient isolation during transmitting or receiving the RF signal Srf. When turned on, each transistor Tsh(1) to Tsh(N) may be regarded as having an ON-resistance. When turned off, each transistor Tsh(1) to Tsh(N) may be regarded as having an OFF-capacitance. The ON-resistance of each transistor Tsh(1) to Tsh(N) may be identical to or different from each other. In some embodiments, each of the transistors Tsh(1) to Tsh(N) may have identical ON-resistance when the transistors Tsh(1) to Tsh(N) are turned on. In other embodiments, at least two transistors in the transistors Tsh(1) to Tsh(N) may have at least two different impedances when the transistors Tsh(1) to Tsh(N) are turned on. The transistors Tsh(1) to Tsh(N) may be N-type metal-oxide-semiconductor field-effect transistors (MOSFET). In some embodiments, the transistors Tsh(1) to Tsh(N) may be P-type MOSFETs or other types of transistors.

In the embodiment, the transistor sizes of the transistors Tsh(1) to Tsh(N) may be equal. The control signal Vcsh may be used to switch the shunt path 14 to the ON state (first state) or the OFF state (second state). For example, when the control signal Vcsh is set to a high voltage (e.g., 2.5V), the transistors Tsh(1) to Tsh(N) are all turned on to switch the shunt path 14 to the ON state. At this time, each transistor Tsh(1) to Tsh(N) may have equal ON-resistance, and the transistors Tsh(1) to Tsh(N) may be equivalent to N stacked ON-resistances to enable the shunt path 14 to have a first impedance (e.g., 50Ω). When the control signal Vcsh is set to a low voltage (e.g., −2.5V), the transistors Tsh(1) to Tsh(N) are all turned off to switch the shunt path 14 to the OFF state. At this time, each transistor Tsh(1) to Tsh(N) may have equal OFF-capacitance, and the transistors Tsh(1) to Tsh(N) may be equivalent to N stacked OFF-capacitances to enable the shunt path 14 to have a second impedance.

The transistor number N may be positively correlated to the transistor size of the transistors Tsh(1) to Tsh(N), that is, the larger the transistor number N is, the larger the transistor size of the transistors Tsh(1) to Tsh(N) will be. If the channel lengths of the transistors Tsh(1) to Tsh(N) are equal, the transistor size of the transistors Tsh(1) to Tsh(N) may be represented by the total channel width of each transistor Tsh(1) to Tsh(N). For example, if N=10, the total channel width of each transistor Tsh(1) to Tsh(N) may be configured to 1 millimeter (mm) to provide an ON-resistance of 5Ω for each transistor Tsh(1) to Tsh(N), generating a first impedance of 50Ω for the transistors Tsh(1) to Tsh(N). When N=20, the total channel width of each transistor Tsh(1) to Tsh(N) may be configured to 2 mm to provide an ON-resistance of 2.5Ω for each transistor Tsh(1) to Tsh(N), maintaining the first impedance of 50Ω for the transistors Tsh(1) to Tsh(N). The total channel width of each transistor Tsh(1) to Tsh(N) may be a product of the finger width and the number of fingers. For example, the finger width of each transistor Tsh(1) to Tsh(N) may be 10 micrometers (um), and the number of fingers may be 100, resulting in a total channel width of each transistor Tsh(1) to Tsh(N) being 1 mm (=(10*10^−6)*100). In another example, the finger width of each transistor Tsh(1) to Tsh(N) may be 10 um, and the number of fingers may be 200, resulting in a total channel width of each transistor Tsh(1) to Tsh(N) being 2 mm (=(10*10^−6)*200).

In some embodiments, the state and impedance of the shunt path 14 may be shown as Table 1:

TABLE 1

| State | Vcsh(V) | Impedance (Ω) |
|---|---|---|
| ON | 2.5 | 50 |
| OFF | −2.5 | 1/jw(Coff/(N)) |

In Table 1, when the shunt path 14 is switched to the ON state, the transistors Tsh(1) to Tsh(N) receive 2.5V to be turned on, providing a first impedance of 50Ω for the shunt path 14. When the shunt path 14 is switched to the OFF state, the transistors Tsh(1) to Tsh(N) receive −2.5V to be turned off, providing a second impedance of 1/jw(Coff/(N))Ω for the shunt path 14, where w is the frequency of the RF Signal Srf, Coff is the equivalent capacitance of each transistor Tsh(1) to Tsh(N) when turned off, and N is the transistor number of the transistor Tsh(1) to Tsh(N). The first impedance (50Ω) and the second impedance (1/jw(Coff/(N)) ohms) are different, and the first impedance matches the load impedance.

Although the embodiment in Table 1 shows that the first impedance is 50Ω, those skilled in the art would recognize that the transistor sizes of transistors Tsh(1) to Tsh(N) may be modified according to actual requirements to adjust the first impedance to other suitable impedances. Generally speaking, for better isolation, the first impedance of the shunt switch 14 may be designed as low as possible, that is, the ideal value of the first impedance is close to 0 ohms. In comparison, embodiments of the present invention are specifically designed to, the first impedance may be between 40Ω and 85Ω to achieve impedance matching to the load impedance. When the shunt path 14 is switched to the ON state, since the RF signal Srf will be guided to the reference voltage terminal REF via the first impedance matching the load resistance, no signal reflection will occur, preventing the signal source from being damaged.

Although Table 1 shows that the control signal Vcsh of −2.5V is used to turn off the transistors Tsh(1) to Tsh(N), those skilled in the art would recognize other values lower than −2.5V may be adopted for the control signal Vcsh to turn off the transistors Tsh(1) to Tsh(N). In addition, although Table 1 shows that the control signal Vcsh of 2.5V is used to turn on the transistors Tsh(1) to Tsh(N), those skilled in the art would recognize other values higher than 2.5V may be adopted for the control signal Vcsh to turn on the transistors Tsh(1) to Tsh(N). In some embodiments, those skilled in the art may adjust the ON-resistances of the transistors Tsh(1) to Tsh(N) by the control voltage Vcsh.

When the RF switch 1 is turned off, the shunt path 14 may provide an equivalent resistance equal to the load resistance, protecting the signal source from being damaged by signal reflection without increasing the circuit area.

Figure 2:
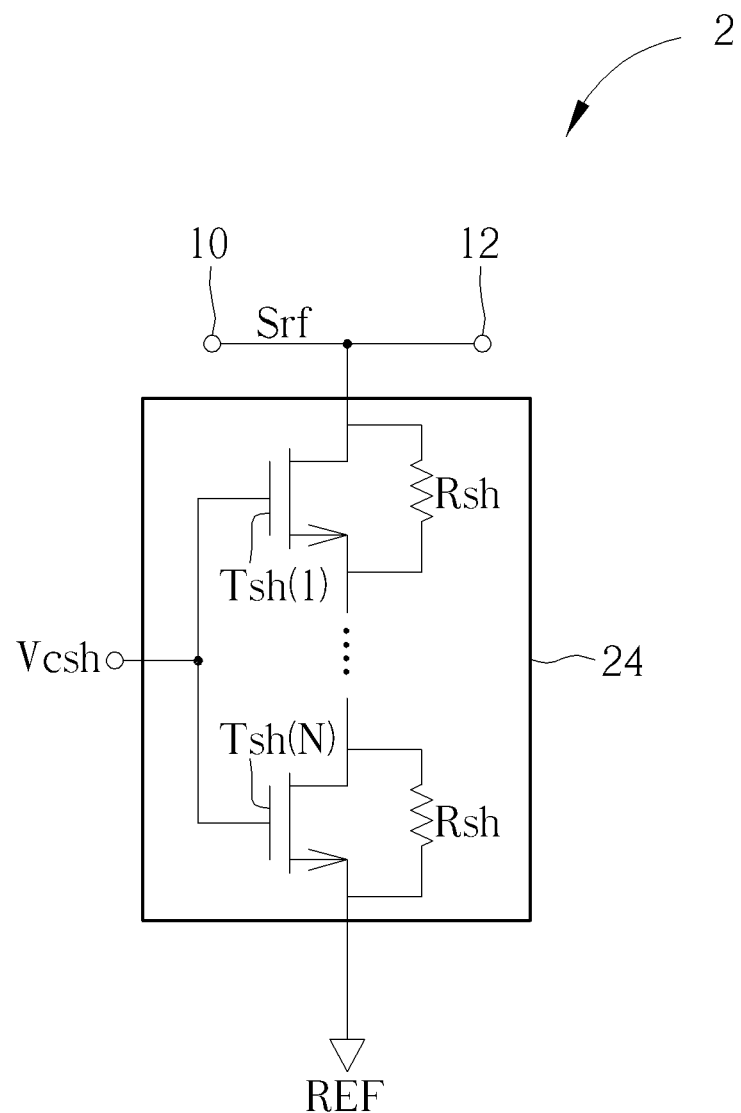
FIG. 2 is a schematic diagram of an RF switch according to another embodiment of the invention.

FIG. 2 is a schematic diagram of an RF switch 2 according to another embodiment of the invention. The RF switch 2 and the RF switch 1 are different in that the shunt path 24 may further include N resistors Rsh, each resistor Rsh is coupled to the first terminal and the second terminal of a corresponding transistor Tsh(n), and n is a positive integer ranging from 1 to N. The resistance of each resistor Rsh may be equal, and may be between 10 kΩ and 50 kΩ. For example, the resistance of each resistor Rsh may be 10 kΩ. The resistor Rsh may fix the voltages of the first terminal and the second terminal of the transistor Tsh(n) when the transistor Tsh(n) is turned off. For example, the voltage of the first terminal and the second terminal of the transistor Tsh(n) may be fixed at 0V. The operation method of the RF switch 2 is similar to that of the RF switch 1, and will not be repeated here.

Figure 3:
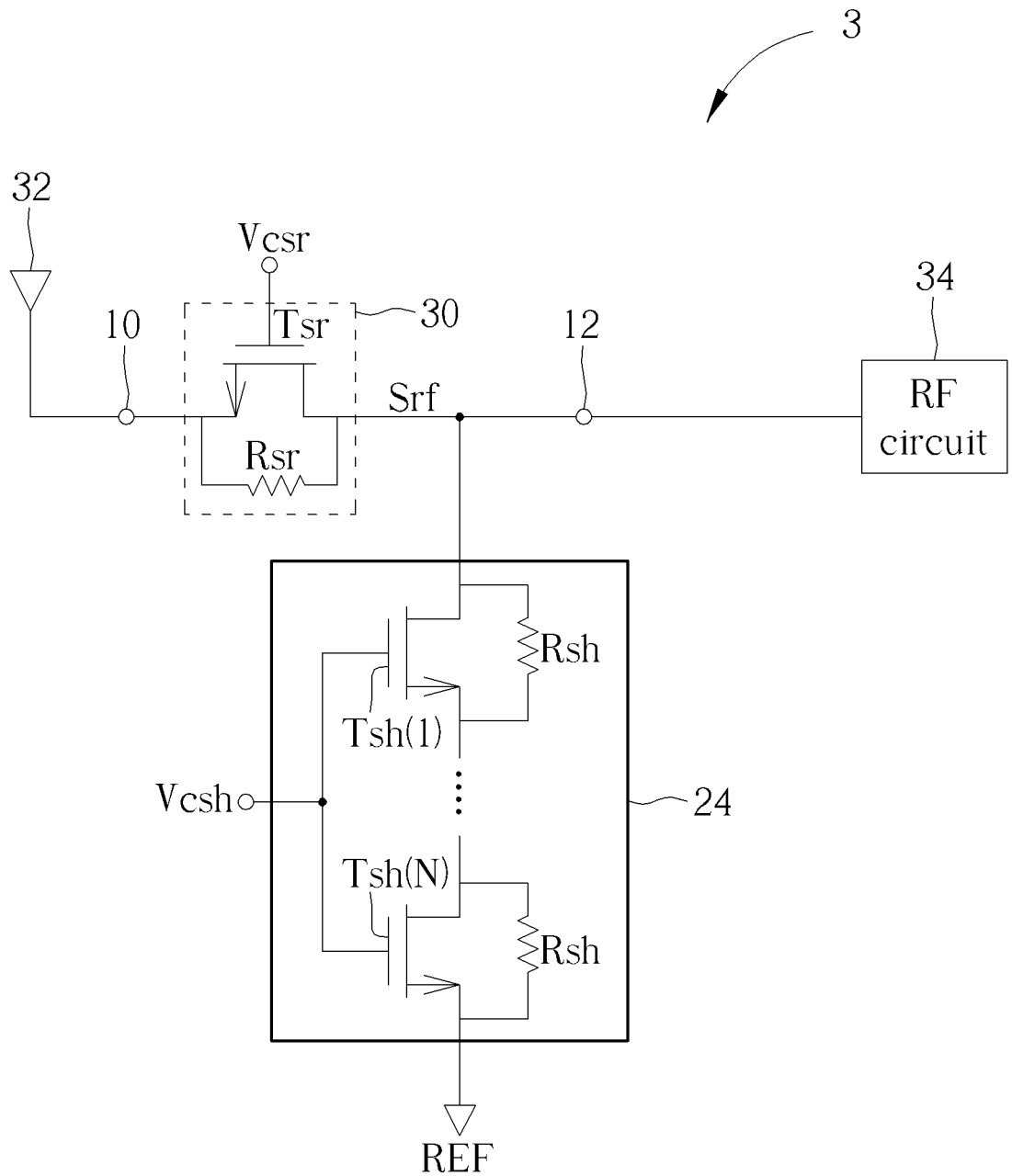
FIG. 3 is a schematic diagram of an RF switch according to another embodiment of the invention.

FIG. 3 is a schematic diagram of an RF switch 3 according to another embodiment of the invention. The RF switch 3 and the RF switch 2 are different in that the RF switch 3 further includes a series path 30. The series path 30 includes a first terminal coupled to the signal terminal 10 and a second terminal coupled to the signal terminal 12. The signal terminal 10 may be coupled to the antenna 32, and the signal terminal 12 may be coupled to the RF circuit 34. The RF circuit 34 may be a matching circuit, a power amplifier, or other circuits. When the series path 30 is connected, the series path 30 may establish a coupling between the signal terminal 10 and the signal terminal 12 to transmit the RF signal Srf between the signal terminal 10 and the signal terminal 12. When the series path 30 is disconnected, The series path 30 may disconnect the coupling between the signal terminal 10 and the signal terminal 12 to prevent the RF signal Srf from being transmitted between the signal terminal 10 and the signal terminal 12. The equivalent resistance of the antenna 32 and the equivalent resistance of the RF circuit 34 may be substantially equal. The series path 30 may include a transistor Tsr and a resistor Rsr coupled in parallel. The transistor Tsr includes a first terminal coupled to the signal terminal 10, a second terminal coupled to the shunt path 24 and the signal terminal 12, and a control terminal configured to receive the control voltage Vcsr to control the transistor Tsr. The resistor Rsh includes a first terminal coupled to the first terminal of the transistor Tsr, and a second terminal coupled to the second terminal of the transistor Tsr. The transistor Tsr may be an N-type MOSFET. While FIG. 3 shows that the series path 30 only includes one transistor Tsr and one resistor Rsr, in some embodiments, the series path 30 may further include M transistors Tsr and M resistors Rsr, the M transistors Tsr being sequentially stacked, and each resistor Rsr being coupled to the first terminal and the second terminal of the corresponding stacked transistor Tsr, and M being a positive integer. The operation method of the RF switch 3 is similar to that of the RF switch 2, and will not be repeated here.

Figure 4:
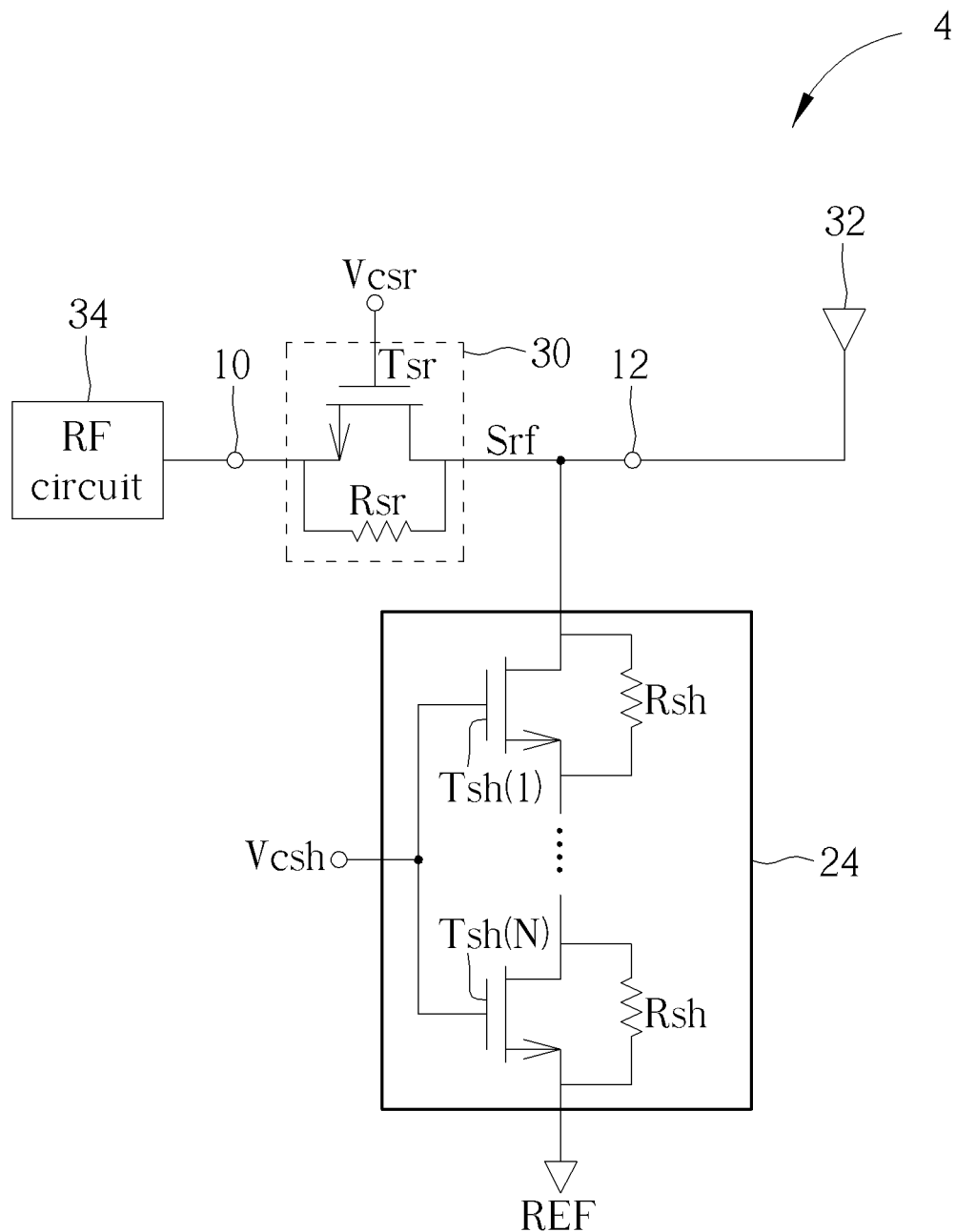
FIG. 4 is a schematic diagram of an RF switch according to another embodiment of the invention.

FIG. 4 is a schematic diagram of an RF switch 4 according to another embodiment of the invention. The RF switch 4 and the RF switch 3 are different in that in the RF switch 4, the signal terminal 10 may be coupled to the RF circuit 34, and the signal terminal 12 may be coupled to the antenna 32. The operation method of the RF switch 4 is similar to that of the RF switch 3, and will not be repeated here.

Figure 5:
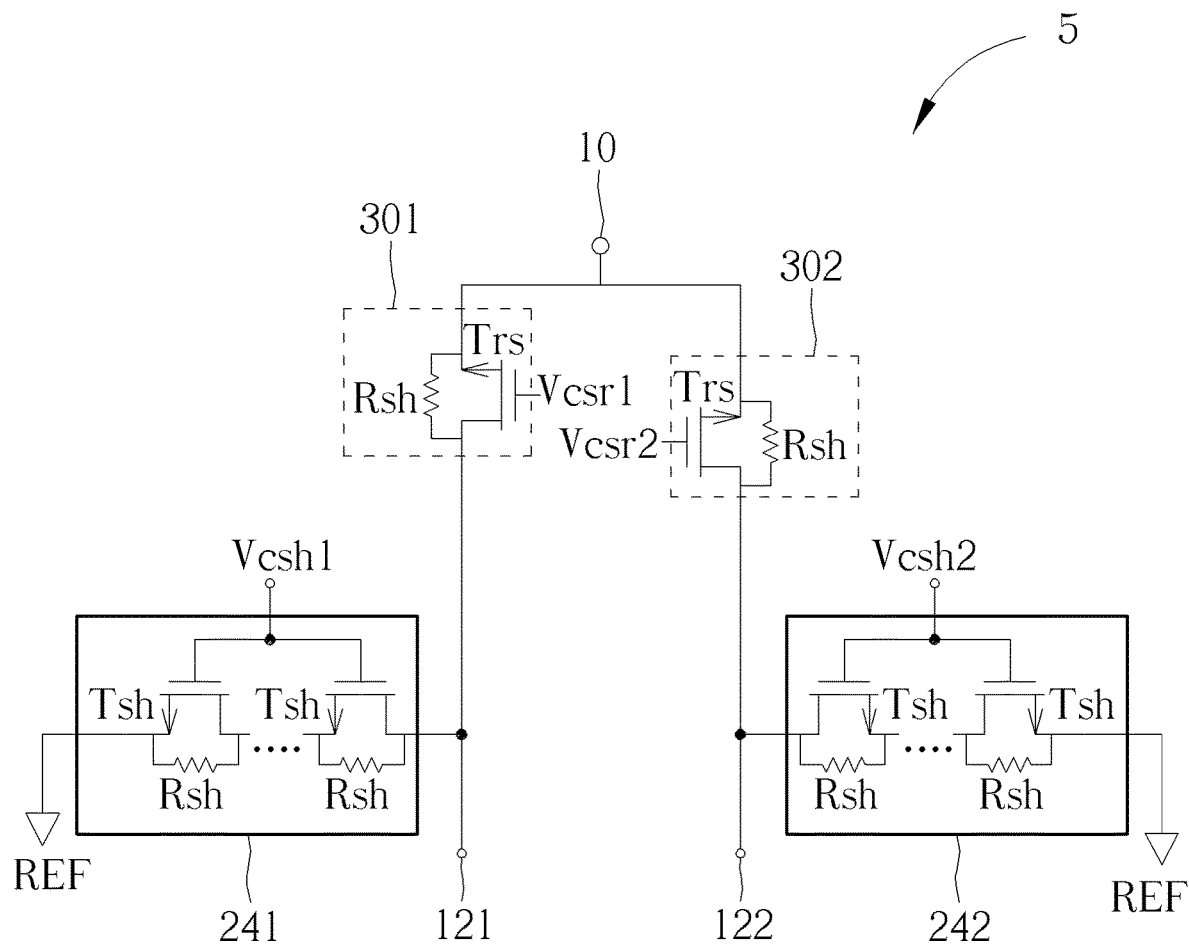
FIG. 5 is a schematic diagram of an RF switch according to another embodiment of the invention.

FIG. 5 is a schematic diagram of an RF switch 5 according to another embodiment of the invention. The RF switch 5 is a single-pole double throw (SPDT) switch. The RF switch 5 and the RF switch 4 are different in that the RF switch 5 further includes series paths 301 and 302, shunt paths 241 and 242, and signal terminals 121 and 122. The transistor types and transistor sizes of the plurality of stacked transistors Tsh in the shunt paths 241 and 242 may be the same. The shunt path 241 may include a first transistor Tsh and a second transistor Tsh. The first transistor Tsh includes a first terminal coupled to the signal terminals 10 and 121; a second terminal; and a control terminal configured to receive a control signal Vcsh1. The second transistor Tsh includes a first terminal coupled to the second terminal of the first transistor Tsh; a second terminal coupled to the reference voltage terminal REF; and a control terminal configured to receive the control signal Vcsh1. The shunt path 242 may include a third transistor Tsh and a fourth transistor Tsh. The third transistor Tsh includes a first terminal coupled to the signal terminals 10 and 122; a second terminal; and a control terminal configured to receive a control signal Vcsh2. The fourth transistor Tsh includes a first terminal coupled to the second terminal of the third transistor Tsh; a second terminal coupled to the reference voltage terminal REF; and a control terminal configured to receive the control signal Vcsh2. When the shunt path 241 is switched to the ON state (first state), the shunt path 241 has a first impedance, and when the shunt path 241 is switched to an OFF state (second state), the shunt path 241 has a second impedance. When the shunt path 242 is switched to the ON state (first state), the shunt path 242 has a first impedance, and when the shunt path 242 is switched to an OFF state (second state), the shunt path 242 has the second impedance. The first impedance matches the load impedance, and the first impedance and the second impedance are different. The circuit configuration and operation mode of the series paths 301 and 302 are similar to the series path 30, and the circuit configuration and operation mode of the shunt paths 241 and 242 are similar to the shunt path 24, and explanation therefor will not be repeated here. The RF switch 5 may receive the control voltages Vcsh1, Vcsr1, Vcsh2, Vcsr2 to form a path between the signal terminal 10 and one of the signal terminals 121 and 122 to transmit or receive the RF signal Srf. When the RF switch 5 forms a path between the signal terminal 10 and the signal terminal 121, the series path 301 is connected, the shunt path 241 is disconnected, the series path 302 is disconnected, and the shunt path 242 is connected. When the RF switch 5 forms a path between the signal terminal 10 and the signal terminal 122, the series path 301 is disconnected, the shunt path 241 is connected, the series path 302 is connected, and the shunt path 242 is disconnected.

The RF switches 1 to 5 may provide an equivalent resistance substantially equal to the load resistance when turned off, protecting the signal source from being damaged by the signal reflection without increasing the circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio frequency (RF) switch comprising:
   an antenna;
   an RF circuit;
   a reference voltage terminal; and
   a first shunt path comprising:
      a first transistor comprising a first terminal coupled between the antenna and the RF circuit; a second terminal; and a control terminal; and
      a second transistor comprising a first terminal coupled to the second terminal of the first transistor; a second terminal coupled to the reference voltage terminal; and a control terminal;
   wherein when the first shunt path is switched to a first state, the first transistor and the second transistor are turned on, and the first shunt path has a first impedance; and when the first shunt path is switched to a second state, the first transistor and the second transistor are turned off, the first shunt path has a second impedance; and the equivalent resistance of the antenna and the equivalent resistance of the RF circuit are substantially equal, and the first impedance matched the equivalent resistance of the antenna and the equivalent resistance of the RF circuit is between 40 ohms and 85 ohms.

2. The RF switch of claim 1, further comprising a series path coupled between a first signal terminal of the RF switch and the RF circuit.

3. The RF switch of claim 1, wherein the second terminal of the second transistor is directly connected to the reference voltage terminal.

4. The RF switch of claim 1, wherein:
when the first shunt path is switched to the first state, the first shunt path is turned on; and
when the first shunt path is switched to the second state, the first shunt path is turned off.

5. The RF switch of claim 1, wherein the first impedance is 50 ohms.

6. The RF switch of claim 1, wherein the first shunt path comprises:
a first resistance coupled between the first terminal and the second terminal of the first transistor; and
a second resistance coupled between the first terminal and the second terminal of the second transistor.

7. The RF switch of claim 1, wherein the first transistor and the second transistor are equal in size.

8. The RF switch of claim 1, wherein the first transistor and the second transistor have different impedances when turned on.

9. A radio frequency (RF) switch comprising:
a first signal terminal;
a reference voltage terminal; and
a first shunt path comprising:
a first transistor comprising a first terminal coupled to the first signal terminal; a second terminal; and a control terminal; and
a second transistor comprising a first terminal coupled to the second terminal of the first transistor; a second terminal coupled to the reference voltage terminal; and a control terminal;
wherein when the first shunt path is switched to a first state, the first shunt path has a first impedance, and when the first shunt path is switched to a second state, the first shunt path has a second impedance, the first impedance and the second impedance being different; and
the first impedance is between 40 ohms and 85 ohms.

10. The RF switch of claim 9, further comprising a series path coupled to the first signal terminal and the RF circuit.

11. The RF switch of claim 9, wherein the first signal terminal is coupled to an antenna.

12. The RF switch of claim 9, wherein the second terminal of the second transistor is directly connected to the reference voltage terminal.

13. The RF switch of claim 9, wherein the first impedance match a load resistance.

14. The RF switch of claim 9, wherein:
when the first shunt path is switched to the first state, the first shunt path is turned on; and
when the first shunt path is switched to the second state, the first shunt path is turned off.

15. The RF switch of claim 9, wherein the first impedance is 50 ohms.

16. The RF switch of claim 9, wherein the first shunt path comprises:
a first resistance coupled between the first terminal and the second terminal of the first transistor; and
a second resistance coupled between the first terminal and the second terminal of the second transistor.

17. The RF switch of claim 9, further comprising:
a second signal terminal coupled to the first terminal of the first transistor;
a third signal terminal; and
a second shunt path comprising:
a third transistor comprising a first terminal coupled to the first signal terminal and the third signal terminal; a second terminal; and a control terminal; and
a fourth transistor comprising a first terminal coupled to the second terminal of the third transistor; a second terminal coupled to the reference voltage terminal; and a control terminal;
wherein when the second shunt path is switched to the first state, the second shunt path has the first impedance, and when the second shunt path is switched to the second state, the second shunt path has the second impedance.

18. A radio frequency (RF) switch comprising:
a first signal terminal coupled to a load having a load impedance;
a reference voltage terminal; and
N stacked transistors comprising a first terminal coupled to the first signal terminal; a second terminal coupled to the reference voltage terminal; and a control terminal, N being a positive integer exceeding 1;
wherein when the N stacked transistors are turned on, the N stacked transistors have a first impedance, when the N stacked transistors are turned off, the N stacked transistors have a second impedance, the first impedance being different from the second impedance; and
the first impedance matches the load impedance.

19. The RF switch of claim 18, wherein the N stacked transistors are equal in size.

20. The RF switch of claim 18, wherein at least two transistors in the N stacked transistors have at least two different impedances when the N stacked transistors are turned on.

* * * * *